United States Patent
Chen

(10) Patent No.: US 10,111,363 B2
(45) Date of Patent: Oct. 23, 2018

(54) SYSTEM FOR EFFECTIVELY TRANSFERING HEAT FROM ELECTRONIC DEVICES AND METHOD FOR FORMING THE SAME

(71) Applicant: Microsoft Corporation, Redmond, WA (US)

(72) Inventor: Yu-Ming Chen, Taoyuan (TW)

(73) Assignee: Microsoft Technology Licensing, LLC, Redmond, WA (US)

(*) Notice: Subject to any disclaimer, the term of this patent is extended or adjusted under 35 U.S.C. 154(b) by 323 days.

(21) Appl. No.: 14/560,401

(22) Filed: Dec. 4, 2014

(65) Prior Publication Data

US 2016/0165748 A1     Jun. 9, 2016

(51) Int. Cl.
*H05K 7/20* (2006.01)
*H01L 23/433* (2006.01)
(Continued)

(52) U.S. Cl.
CPC .......... *H05K 7/20454* (2013.01); *B23P 15/26* (2013.01); *H01L 23/433* (2013.01);
(Continued)

(58) Field of Classification Search
CPC .......... H05K 7/20454; H05K 7/20463; H05K 7/20963; H05K 7/20981; G06F 1/20; G06F 1/203; H01L 23/4334; H01L 23/473
(Continued)

(56) References Cited

U.S. PATENT DOCUMENTS 3,616,533 A * 11/1971 Heap et al. ............... H05K 3/34
                                                          174/526
5,000,256 A *  3/1991 Tousignant ......... H01L 23/3737
                                                         165/104.19
(Continued)

FOREIGN PATENT DOCUMENTS

EP         0472269 A2    2/1992
FR         2977949 A1    1/2013
(Continued)

OTHER PUBLICATIONS

Luo, et al., "Blade Heat Dissipator with Room-Temperature Liquid Metal Running inside a Sheet of Hollow Chamber", In IEEE Transactions on Components, Packaging and Manufacturing Technology, vol. 4, No. 3, Mar. 2014, 6 pages.
(Continued)

*Primary Examiner* — Zachary M Pape
(74) *Attorney, Agent, or Firm* — Lempia Summerfield Katz LLC

(57) ABSTRACT

A system for transferring heat by free convective flows of coolant inside a flexible container is disclosed. The flexible container is able to fully conform with the surface of base and heat sources, and the coolant filled inside the flexible container can easily create free convective flows in a narrow gap for continuously and efficiently remove the heat from the heat sources. A method for forming a heat transfer module is disclosed. The flexible container can be placed on the heat sources and then being inflated by the coolant to fully conform with the surface of base and heat sources. Alternatively, the inflated flexible container is being pressed to fully conform with the surface of base and heat sources during assembly of the heat transfer module.

5 Claims, 6 Drawing Sheets

(51) Int. Cl.
  *B23P 15/26* (2006.01)
  *H01L 23/473* (2006.01)
  *G06F 1/20* (2006.01)

(52) U.S. Cl.
  CPC .............. *H01L 23/473* (2013.01); *G06F 1/20* (2013.01); *H01L 23/4334* (2013.01); *H01L 2924/0002* (2013.01)

(58) Field of Classification Search
  USPC ................. 361/679.46–679.54, 688–723; 165/80.4–80.5, 104.33; 257/712–714; 174/547
  See application file for complete search history.

(56) References Cited

U.S. PATENT DOCUMENTS

| | | | |
|---|---|---|---|
| 5,208,728 A * | 5/1993 | Schirmer | H05K 3/284 174/564 |
| 5,245,508 A * | 9/1993 | Mizzi | H05K 7/20636 165/185 |
| 6,690,578 B2 * | 2/2004 | Edelmann | H05K 7/20454 165/46 |
| 6,724,626 B1 | 4/2004 | Hodes et al. | |
| 7,188,484 B2 | 3/2007 | Kim | |
| 8,218,321 B2 | 7/2012 | Foxenland | |
| 8,246,325 B2 | 8/2012 | Chao et al. | |
| 8,432,691 B2 | 4/2013 | Toftloekke et al. | |
| 9,125,324 B2 * | 9/2015 | Yen | H05K 7/20454 |
| 2011/0259565 A1 * | 10/2011 | Izutani | C09J 9/02 165/185 |
| 2011/0308781 A1 * | 12/2011 | O'Riordan | H01L 23/3737 165/185 |
| 2013/0329355 A1 | 12/2013 | Polubinski | |

FOREIGN PATENT DOCUMENTS

| | | |
|---|---|---|
| JP | S57211257 A | 12/1982 |
| JP | S58188188 A | 11/1983 |
| JP | S6112289 U | 1/1986 |
| JP | S62116557 U | 7/1987 |
| JP | H0313789 U | 2/1991 |
| JP | H0330399 A | 2/1991 |
| JP | 06268113 A | 9/1994 |
| JP | 2003068952 A | 3/2003 |

OTHER PUBLICATIONS

Gupta, Rahul, "NEC launches liquid cooled Android smartphone", Published on: May 20, 2013, Available at: http://www.themobileindian.com/new-launches/2653_NEC-launches-liquid-cooled-Android-smartphone.

"International Preliminary Report on Patentability Issued in PCT Application No. PCT/US2015/062240", dated Feb. 27, 2017, 8 Pages.

"International Search Report and Written Opinion Issued in PCT Application No. PCT/US2015/062240", dated Mar. 21, 2016, 13 Pages.

"Second Written Opinion Issued in PCT Application No. PCT/US2015/062240", dated Dec. 2, 2016, 7 Pages.

"Office Action Issued in European Patent Application No. 15816929.2", dated Jul. 3.2018, 2 Pages.

* cited by examiner

SYSTEM FOR EFFECTIVELY TRANSFERING HEAT FROM ELECTRONIC DEVICES AND METHOD FOR FORMING THE SAME

FIELD OF THE INVENTION

The present invention is generally related to heat transfer enhancing solutions. More specifically, the present invention is directed to a system for effectively transferring heat from electronic devices and methods for forming the same.

BACKGROUND OF THE INVENTION

Heat transfer is always a critical problem for electronic devices. In order to facilitate the operation of the electronic device, heat generated by the internal components, such as electrical circuitry or processor, should be transferred and removed quickly. Recently, electronic devices have been designed to be as thin as possible, leaving very small and narrow gaps between the outer case and internal components of the electronic devices. As such, the air trapped in these gaps becomes a heat transfer barrier and prevents the heat from dissipating to the environment due to the poor heat conductivity of air. Consequently, the heat generated by and accumulated on the internal components of the electronic devices not only reduces the processing speed, but sometimes also causes damage to the chips or processors within the electronic devices.

One known solution is directly attaching a solid metal plate, such as copper or aluminum, to the chip or processor of the electronic devices. The attachment of the metal plate may enhance the heat conduction from the attached electronic component, but could only direct the heat generated by that single component without influencing other heat sources that are not in direct contact with the metal plate. In order to conduct the heat away from different electronic components, each component should be attached with its own heat dissipation plate. Such arrangement not only increases the weight of the electronic device, but also raises the cost of material, as some metal plates with good heat conduction property are expensive.

Another known solution is to seal the outer case of the electronic devices air-tight by filling the gas coolant within the enclosed space. However, the process of forming an air-tight compartment for electronic devices is not economical. Further, the gas coolant will eventually leak away from the case over time, and the replaced air occupying the compartment will lead to the same result of heat transfer barrier.

Further, in a solution that a fan is mounted at the vent opened on the outer case for creating compulsive convection, the air flow may only achieve nice circulation at a limited local area around the vent. If the heat sources are disposed far away from the vent, the air flow around the vent created by the fan cannot take away heat generated by the heat sources easily, and more power is needed for the fan to draw the heat away from the heat sources.

Therefore, a need exist for effectively and continuously removing heat from the electronic devices in a cost effective manner.

SUMMARY OF THE INVENTION

In view of the technical problems stated above, the present invention is aimed at providing solutions that are advantageous over the conventional techniques.

One object of the present invention is a system for transferring heat, comprising: a base; at least one heat source being placed on the base with a heat source surface separate from the base; a flexible container, configured to be conformably in contact with a surface of the base and the heat source surface of the at least one heat source; and a coolant, in the form of either a fluid or a gas, being filled inside the flexible container for creating free convective flows to transfer heat from the heat source surface of the at least one heat source to surroundings.

Another object of the present invention is a method for forming a heat transfer module, comprising: disposing a flexible container on a heat source surface of at least one heat source, wherein the flexible container is substantially flat, and the heat source surface of the at least one heat source is separate from a surface of a base; and inflating the flexible container with a coolant, such that the inflated flexible container is conformably in contact with the heat source surface of the at least one heat source.

Still another object of the present invention is a method for forming a heat transfer module, comprising: disposing the at least one heat source on the base, wherein the heat source surface of the at least one heat source has a different level of height from the surface of the base in a direction; and mounting an outer case over the surface of the base and the heat source surface of the at least one heat source, such that the inflated flexible container is confined in a space between the outer case and the surface of the base, and the shape of the inflated flexible container fully conforms with the surface of the base and the heat source surface of the at least one heat source.

It is to be understood that both the foregoing summary and the following detailed description are exemplary and are intended to provide further explanation of the disclosed subject matter as claimed. Other features, objects, and advantages of the present invention will be apparent from the description, the accompanying drawings, and the appended claims.

BRIEF DESCRIPTION OF THE DRAWINGS

Different aspects can be understood from the following detailed description when read with the accompanying figures. It should be noted that, in accordance with the standard practice, various features are not drawn to scale. In fact, the dimensions of the various features may be arbitrarily increased or reduced for clarity of discussion.

DETAILED DESCRIPTION

Figure 1:
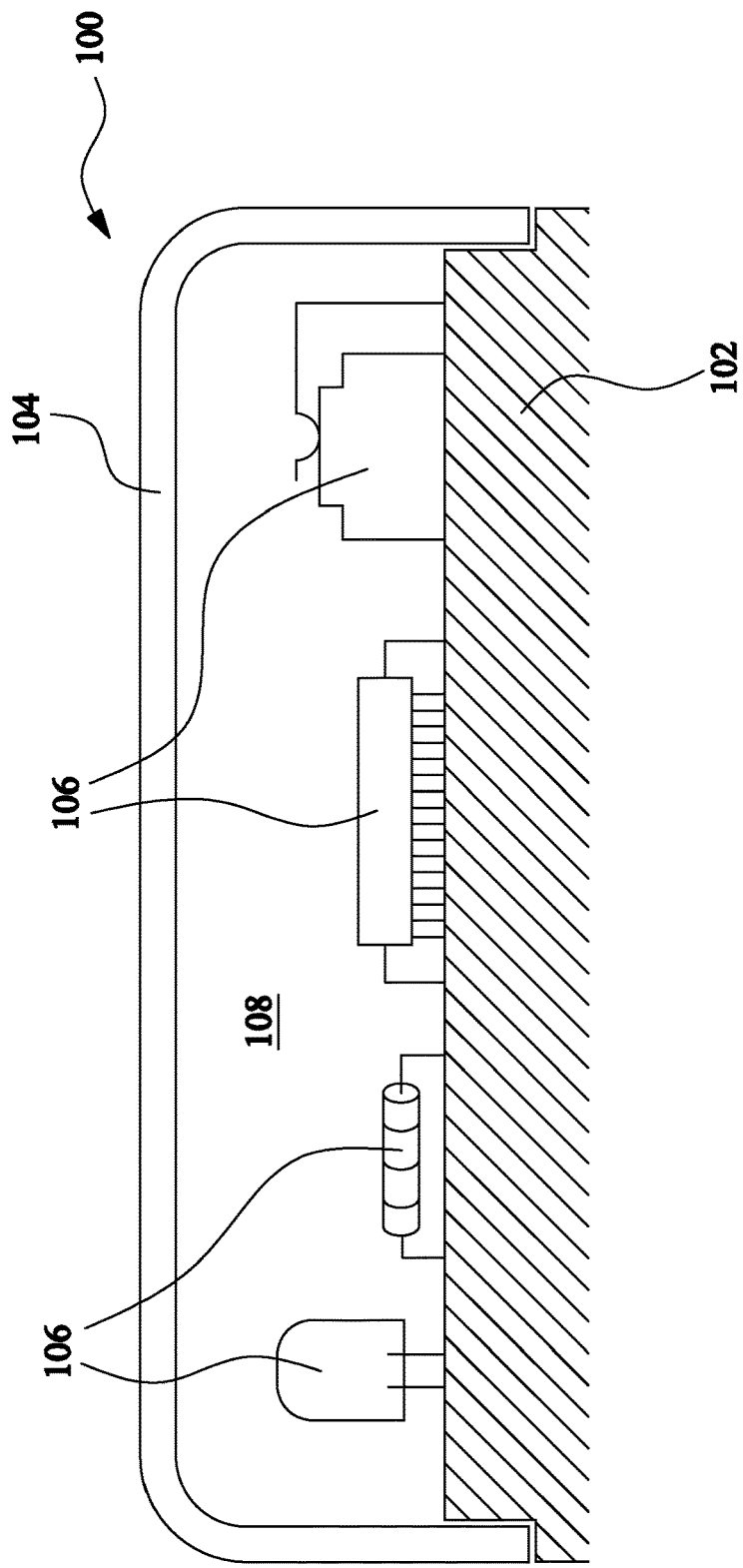
FIG. 1 illustrates a conventional electronic device with a plurality of electronic components disposed therein.

Electronic devices usually contain a circuit board with a lot of different electronic components mounted thereon. With reference to FIG. 1, the electronic device 100 has a circuit board 102 as a base, and covered by an outer case 104. Many different electronic components 106 are mounted on the circuit board 102 for performing different functions of the electronic device 100.

As the trend of designing thin electronic devices, the space between the outer case 104 and the circuit board 102 should be as small as possible, leaving very narrow gap 108 between the outer case 104 and each electronic component 106. Further, since each electronic component 106 disposed on the circuit board 102 has different shape, especially different height for different functional electronic component 106, the rugged surface causes a complex geometry for the gap 108.

According to the theory of convection, Rayleigh number (Ra) should be larger than a critical value to create a free convection of heat:

$$Ra = \frac{g\beta(Th - Tl)h^3}{\alpha v}$$

g: gravitational acceleration
β: volumetric thermal expansion coefficient
Th: higher temperature at the lower boundary
Tl: lower temperature at the upper boundary
h: height between the upper and lower boundaries
v: kinematics viscosity of fluid
α: thermal diffusivity of fluid It is known that the critical value of Ra is 1708 for two parallel plates with side boundaries. In the case that the temperature difference between the heat source at the lower boundary (Tl) and the surroundings of the upper boundary (Th) is 5° C., the height between the upper and lower boundaries (h) should be at least about 18 mm to create free convections of dry air. As the temperature difference increases, the height (h) that can create free convections of dry air may be smaller than about 18 mm. In other words, air filled in the gap 108 does not function to take away the heat from the electronic components 106 by free convection if the gap 108 is too narrow or the temperature differences are not enough. In such case, the heat will build up around the electronic components 106, and air may even become a heat transfer barrier as the thermal conductivity for air is very poor.

Figure 2:
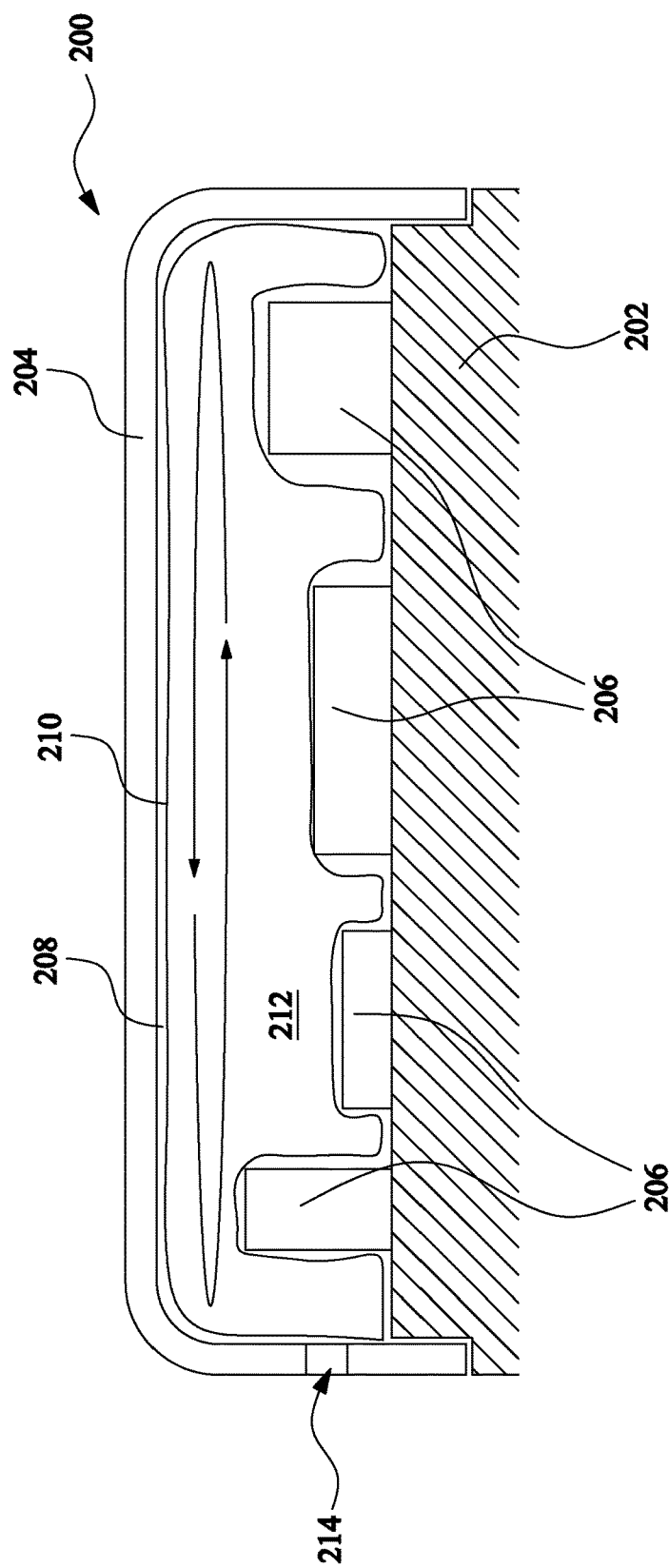
FIG. 2 illustrates a heat transferring system according to one embodiment of the invention.

FIG. 2 illustrates a heat transferring system according to one embodiment of the invention. In FIG. 2, the system is shown as an electronic device 200. However, other similar devices with heat sources enclosed therein are also considered.

As shown in FIG. 2, one or more heat sources 206 are mounted on the base 202, generating heat during operation of the device. For example, the heat sources 206 may include resistance, capacitor, inductance, chip or processor, memories, battery, motor, vibrator, hard drive and/or power supplies. Other components that generate heat during operation are also considered. An outer case 204 covers the base 202 for enclosing the one or more heat sources 206, forming a small space or gap 208 between the outer case 204 and the base 202 and/or each heat source 206. The gap 208 may or may not be sealed by the outer case 204. In the embodiment shown in FIG. 2, a vent 214 is opened at one side of the outer case 204. In other embodiments, there may be more than one vent disposed on any place of the outer case 204. In the case that the gap 208 has been tightly sealed by the outer case 204, no vents or openings are disposed on the outer case 204 or base 202.

Instead of only air as shown in FIG. 1, the gap 208 in FIG. 2 is fully occupied by a flexible container 210 filled with coolant 212. Although different shapes of the heat sources 206 form a complex geometry on the base 202, the flexible container 210 within the gap 208 is able to fully conform with the surface of the base 202 and the heat source surfaces of the heat sources 206, such that the flexible container is in touch with each heat source 206 on the base 202.

The flexible container 210 can be made of a variety of materials. A thin plastic membrane or rubber may be considered to have nice flexibility. Silicon, the mixture of silicon and rubber, or other materials having good flexibility and good thermal conductivities are also considered for forming the flexible container. In one embodiment, the flexible container 210 can be made of silicone rubber, and sustains high temperature up to 200° C. In another embodiment, the flexible container 210 is comprised of thermally conductive plastics, which may achieve the thermal conductivity up to 15 W/mK.

The membrane forming the flexible container 210 should be as thin as possible, such that the thermal conductivity and the flexibility of the membrane enhance the heat transfer from the heat sources 206 to the coolant 212 contained inside the flexible container 210. However, it should be also aware that the membrane forming the flexible container 210 should be strength enough to prevent the flexible container 210 from bursting during inflation. As long as the heat generated by the heat sources 206 can be quickly removed away from the contact point of the flexible container 210, the thin membrane forming the flexible container 210 will not reach its melting point, and can hold the coolant 212 sealed inside.

Coolant 212, in the form of either gas or fluid, is filled inside the flexible container 210. As stated above, the coolant 212 is used to replace air to transfer heat from the heat source surfaces of heat sources 206 to the surroundings by free convection. In order to create free convective flows between the small gap 208, the coolant 212 is selected to easily raise the value of Rayleigh number (Ra) higher than the critical value. Consequently, the free convective flows of the coolant 212 inside the flexible container 210 are able to continuously remove the heat from the heat sources 206 to the surroundings. It is preferred to create a turbulence inside the flexible container, by the nature of coolant or the movement of a user when using the electronic device, as the turbulent flow will quickly remove the heat away from the heat sources 206. Examples of coolant being applied in the flexible container 210 includes, for example, pure water, Freon®, and methanol. Other suitable substances, in a form of either gas or fluid and with a good property for creating convection, may also be considered.

Figure 3A:
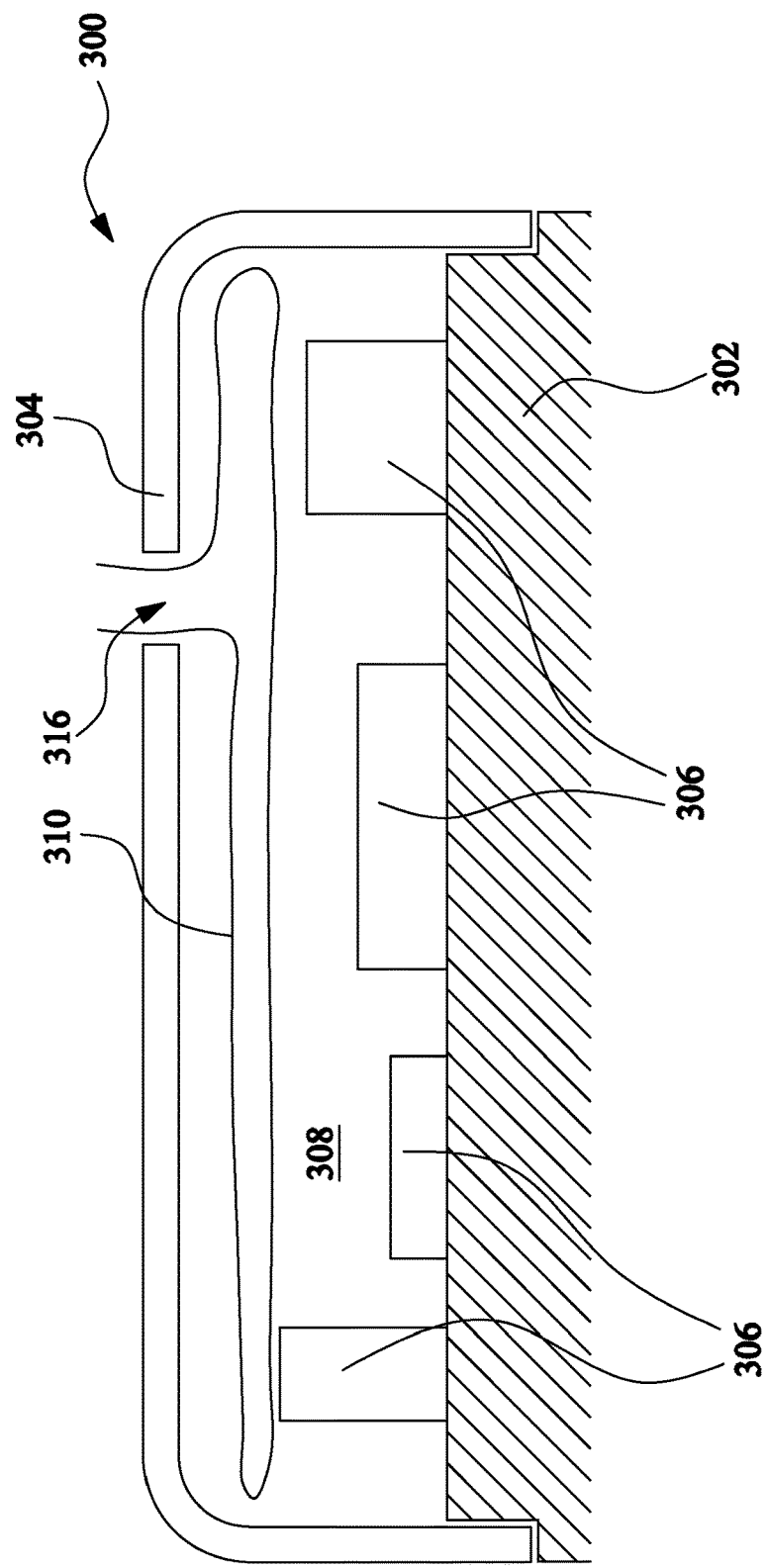
FIGS. 3a and 3b illustrate an embodiment for packing or assembling the electronic device of FIG. 2.
Figure 3B:
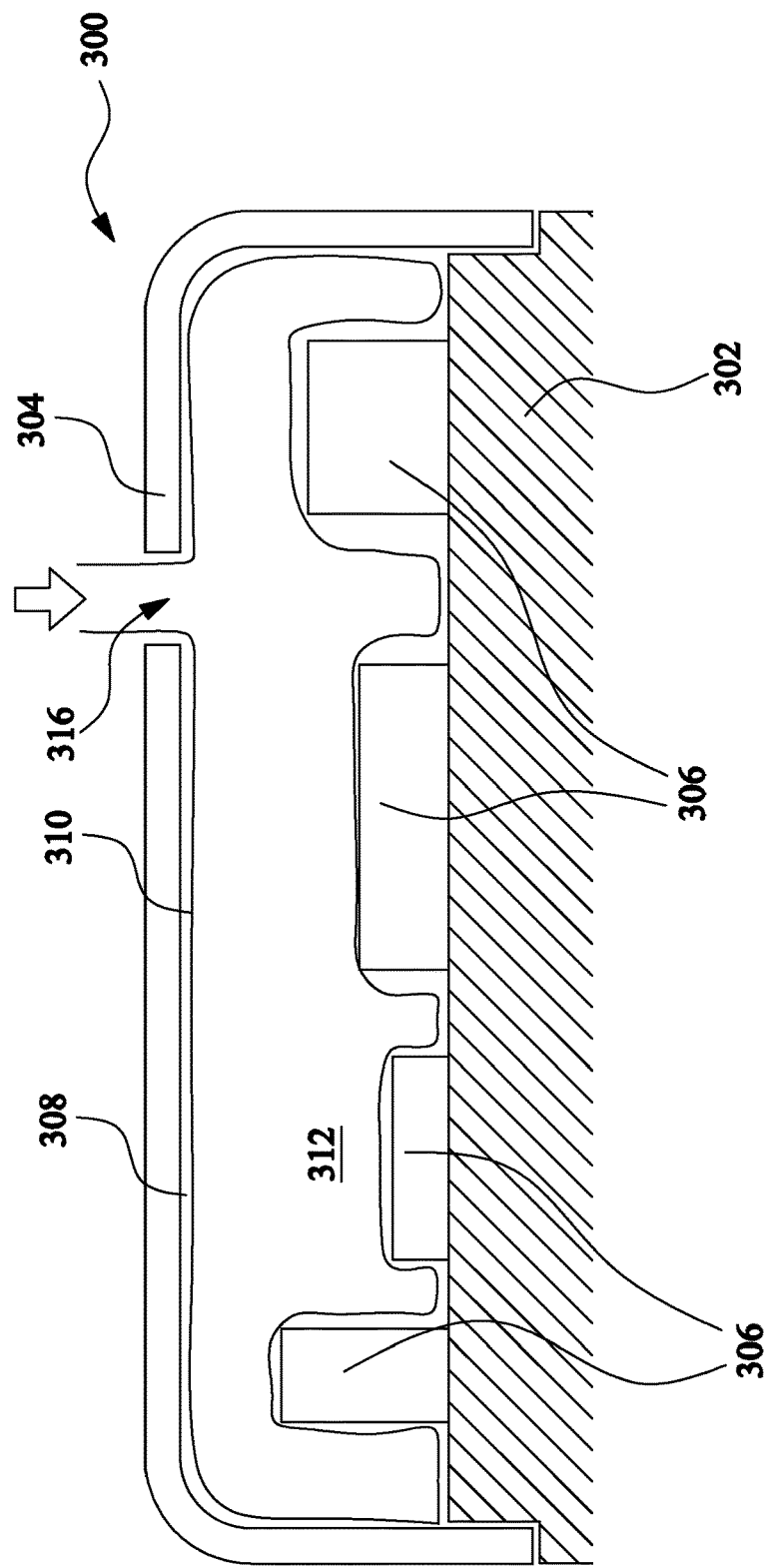

FIGS. 3a and 3b illustrate an embodiment for forming or assembling the electronic device of FIG. 2. As shown in FIG. 3a, a flattened flexible container 310 with an opening 316 is configured to be in contact with the heat source surfaces, for example, be placed on top, of the heat sources 306 during assembly of the electronic device 300. In such case, the base 302 and the outer case 304 may be formed integrally, and the flattened flexible container 310 can be stuck inside the gap 308 after mounting the heat source 306 (such as processors or batteries) without any difficulties.

Next, in FIG. 3b, the flexible container 310 is filled with coolant 312 through the opening 316. As the coolant 312 is inflated, the flexible container 310 expands and fully occupies the gap 308 confined by the outer case 304, the base 302, and the heat sources 306 being mounted thereon. Eventually, the flexible container 310 conforms with the rugged surface and complex geometry caused by the heat sources 306 and the base 302, and directly contacts with each of the heat sources 306. The opening 316 of the flexible container 310 will then be sealed after filling the coolant 312 for permanently holding the coolant 312 inside.

During the inflation of coolant 312, a vacuum environment can be provided around electronic device 300 to facilitate draining the air out from the gap 308. Such arrangement may increase the speed of inflation and enhance the shape of the flexible container 310 to conform with the heat source faces of the heat sources 306. The action of draining air from the gap can be done by placing the electronic device 300 in a negative pressure chamber.

Figure 4A:
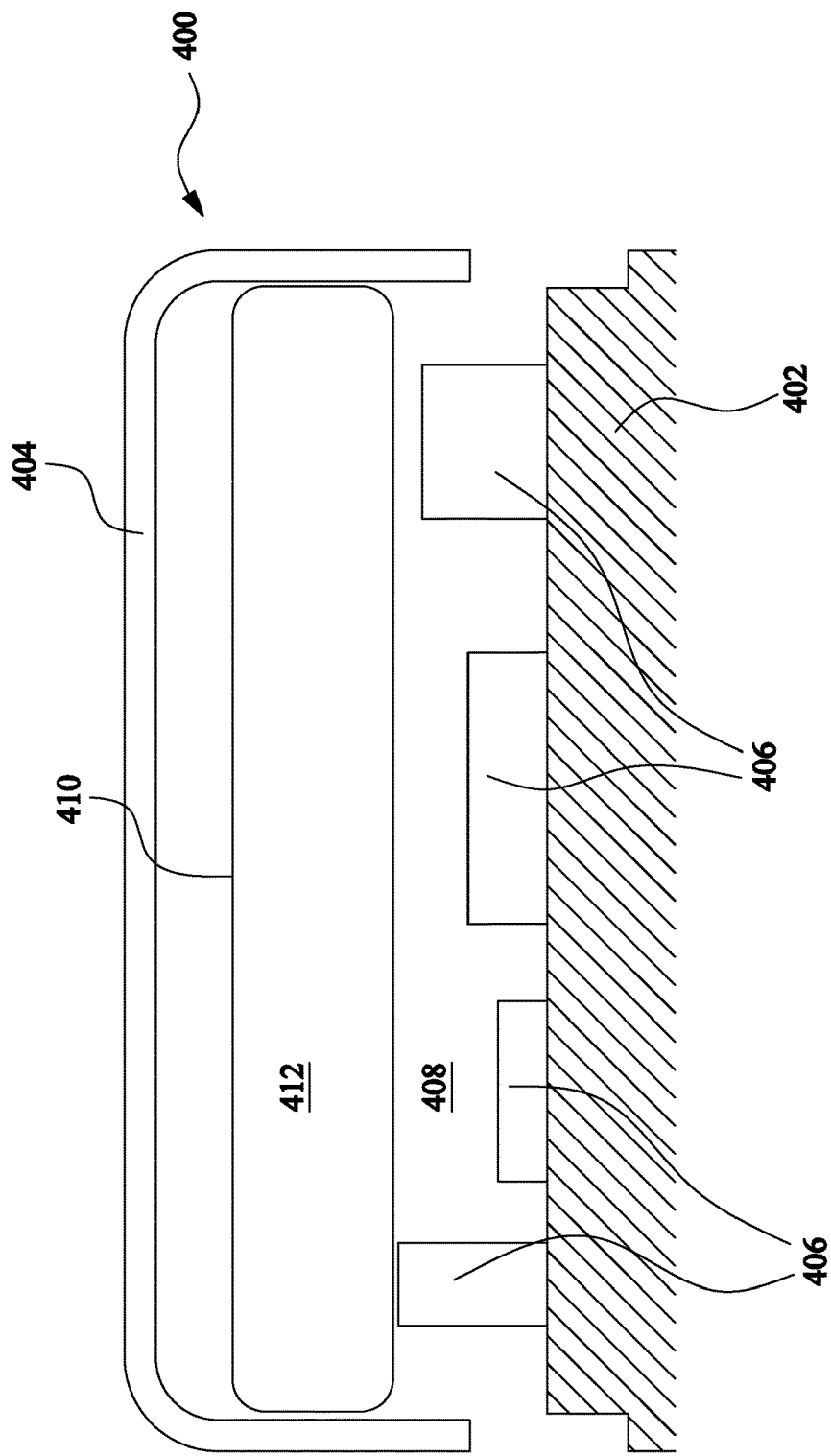
FIGS. 4a and 4b illustrate another embodiment for packing or assembling the electronic device of FIG. 2.
Figure 4B:
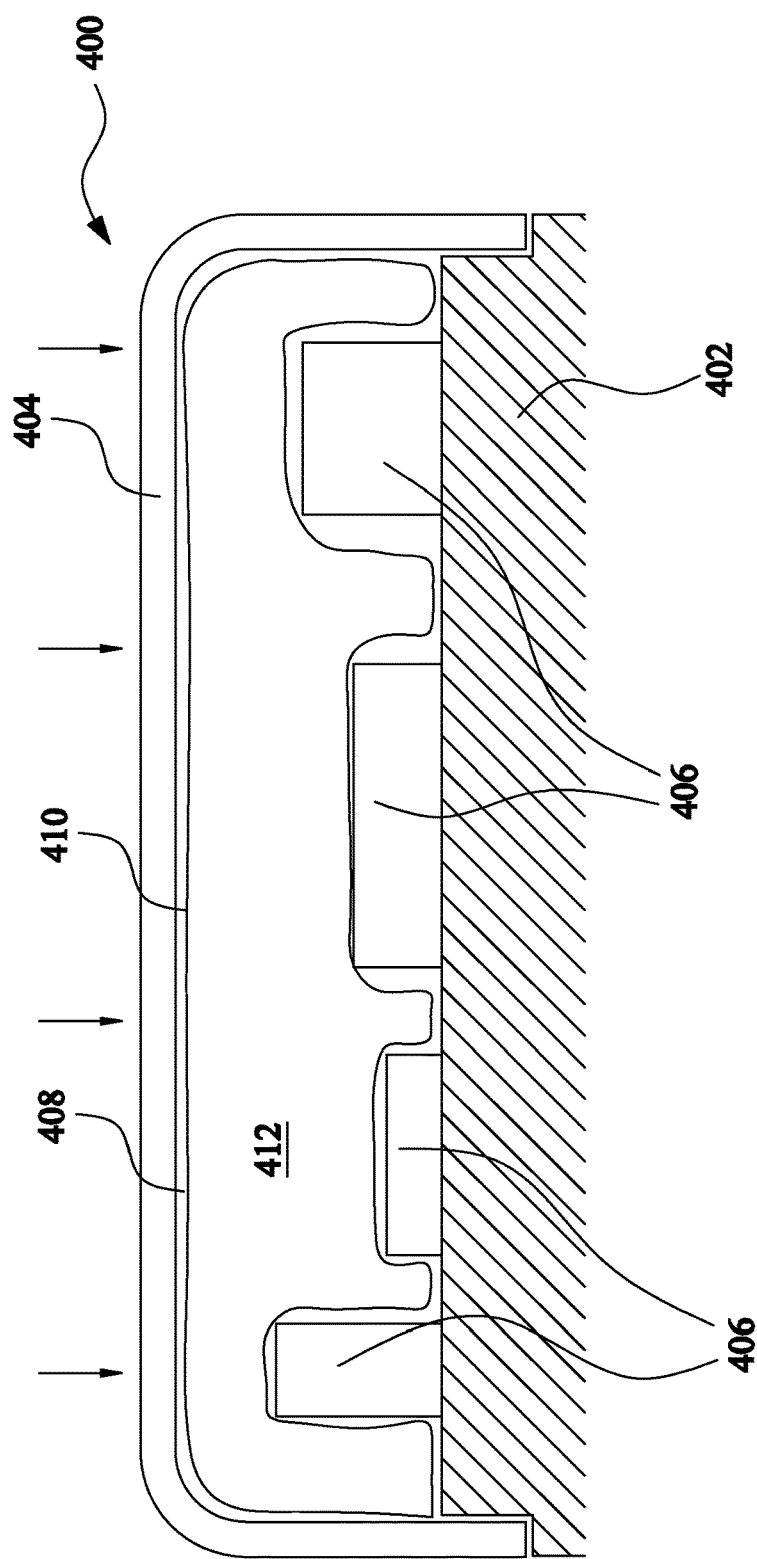

FIGS. 4a and 4b illustrate another embodiment for forming or assembling the electronic device of FIG. 2. With reference to FIG. 4a, the flexible container 410 is inflated by coolant 412 to form a balloon prior to the assembly of outer case 404. Next, the outer case 404 is assembled to the base 402 by pressing the balloon formed by the flexible container 410 against the rugged surface of the heat sources 406 and base 402. The amount of coolant 412 filled within the flexible container 410 has been calculated or measured to properly fit within the gap 408, such that the balloon will not burst by the pressing force during the electronic device is assembled, and does not leave too much empty space around the sides of the heat sources 406. Due to the flexibility of the balloon, the surface of the flexible container 410 will deform while being pressed, and fully conform with the surface of the base 402 and the heat source surfaces of the heat sources 406.

While pressing the balloon onto the heat sources 406 and base 402, a vacuum environment can be provided around the electronic device to facilitate draining the air out from the gap 408. Such arrangement may increase the speed of inflation and enhance the flexible container 410 to conform with the shape of the heat sources 406. The action of draining air from the gap can be done by placing the device 400 in a negative pressure chamber.

Turning back to FIG. 2, during operation of the electronic device 200, the heat generated by heat sources 206 will be first directly conducted through the contacted regions of the flexible container 210, and transferred to the coolant 212. Due to the excellent properties of coolant 212, the value of Rayleigh number (Ra) easily exceeds the critical value by the temperature differences between the heat sources 206 and the top of outer case 204. Therefore, free convective flows of the coolant 212 can be easily created inside the flexible container 210 to transfer the heat away from the heat source surfaces of heat sources 206 through the outer case 204 to the surroundings. In a preferred embodiment, the outer case 204 can also be made of thermal conductive materials, for enhancing the diffusion of heat.

In addition, it is known that the convection coefficient and thermal conductivity for dry air is poor relative to many different substrates. As a result, even if the gap 208 between the outer case 204 and each heat source 206 is wide enough for air to create free convective flows, such free convective air flows cannot take away much heat from the heat sources 206. Thus, the flexible container 210 with coolant 212 filled therein can be applied within any shapes or sizes of gap 208 to efficiently and continuously take away heat from the heat sources 206. As an example, but not limitations, the heat transferring system of flexible container 210 with coolant 212 filled therein can be applied within a smart phone, screen panels, tablet computers, and/or personal computers. Further, larger machines, such as video game players, audio systems, servers, and/or equipments with motors or vibrators disposed therein, are also applicable. By replacing the air with the heat transferring system of flexible container, the coolant may adventurously transfer the heat away from heat sources in an efficient and continuous manner.

While various embodiments have been described in details with reference to the accompany drawings as shown, it will be understood that the invention is not limited to the disclosed embodiments as stated above. Rather, it is intended to cover various modifications and alternations which fall within the spirit and scope of the appended claims as follows.

What is claimed is:

1. A method for forming a heat transfer module, the method comprising:
   disposing a flexible container on a heat source surface of at least one heat source placed on a base, wherein the flexible container is substantially flat, and the heat source surface of the at least one heat source is separate from a surface of the base;
   inflating the flexible container with a coolant, such that the inflated flexible container is conformably in contact with the surface of the base and the heat source surface of the at least one heat source;
   mounting an outer case over the surface of the base and the heat source surface of the at least one heat source, such that the inflated flexible container is confined in a space between the outer case and the surface of the base;
   draining air from the space between the outer case and the surface of the base to enhance the shape of the inflated flexible container in conformity with the surface of the base and the heat source surface of the at least one heat source; and
   sealing the inflated flexible container, such that the flexible container completely encloses the coolant and the coolant remains inside the flexible container, the sealing of the inflated flexible container including sealing the inflated flexible container prior to the mounting of the outer case,
   wherein the heat source surface of the at least one heat source has a different level of height from the surface of the base in a direction.

2. The method of claim 1, wherein the draining comprises placing the heat transfer module in a negative pressure chamber.

3. The method of claim 1, further comprising:
   creating free convective flows of the coolant within the inflated flexible container to transfer heat away from the heat source surface of the at least one heat source to surroundings.

4. A method for forming a heat transfer module, the method comprising:
   providing a base with at least one heat source placed thereon, wherein the at least one heat source has a heat source surface separate from a surface of the base;
   inflating a flexible container with a coolant to form an inflated balloon;
   pressing the inflated balloon against the surface of the base and the heat source surface of the at least one heat source, such that the inflated balloon is conformably in contact with the surface of the base and the heat source surface of the at least one heat source, the pressing of the inflated balloon against the surface of the base and the heat source surface of the at least one heat source comprising mounting an outer case over the surface of the base and the heat source surface of the at least one heat source, such that the inflated balloon is confined in a space between the outer case and the surface of the base;
   draining air from the space between the outer case and the surface of the base to enhance the shape of the inflated balloon in conformity with the surface of the base and the heat source surface of the at least one heat source; and sealing the inflated flexible container, such that the flexible container completely encloses the coolant and the coolant remains inside the flexible container, the sealing of the inflated flexible container including sealing the inflated flexible container prior to the mounting of the outer case, wherein the heat source surface of the at least one heat source has a different level of height from the surface of the base in a direction.

5. The method of claim 4, wherein the draining comprises placing the heat transfer module in a negative pressure chamber.

* * * * *